United States Patent [19]

Fujita et al.

[11] Patent Number: 4,551,841
[45] Date of Patent: Nov. 5, 1985

[54] ONE-CHIP SEMICONDUCTOR DEVICE INCORPORATING A POWER-SUPPLY-POTENTIAL DETECTING CIRCUIT WITH RESET FUNCTION

[75] Inventors: Kouichi Fujita, Yokohama; Moritoshi Shirato, Kawagoe, both of Japan

[73] Assignee: Fujitsu Limited, Kawasaki, Japan

[21] Appl. No.: 502,591

[22] Filed: Jun. 9, 1983

[30] Foreign Application Priority Data

Jun. 9, 1982 [JP] Japan .................. 57-098649
Jun. 30, 1982 [JP] Japan .................. 57-113308

[51] Int. Cl.[4] ............................ G06F 11/00
[52] U.S. Cl. ...................... 371/66; 364/900; 371/12
[58] Field of Search ......... 371/66, 12; 364/200, 364/900; 307/66, 362

[56] References Cited

U.S. PATENT DOCUMENTS

| 4,013,902 | 3/1977 | Payne | 307/268 |
|---|---|---|---|
| 4,048,524 | 9/1977 | Laugesen et al. | 307/304 |
| 4,173,756 | 11/1979 | Kawagai et al. | 340/636 |
| 4,200,916 | 4/1980 | Seipp | 364/900 |
| 4,234,920 | 11/1980 | Van Ness et al. | 364/200 |
| 4,244,050 | 1/1981 | Weber et al. | 371/66 |
| 4,296,338 | 10/1981 | Thomas | 307/362 |
| 4,301,380 | 11/1981 | Thomas | 307/362 |
| 4,410,991 | 10/1983 | Lenart | 371/66 |
| 4,429,366 | 1/1984 | Kennon | 364/900 X |
| 4,438,431 | 3/1984 | Toyomura | 371/66 X |

Primary Examiner—Charles E. Atkinson
Attorney, Agent, or Firm—Staas & Halsey

[57] ABSTRACT

A one-chip semiconductor device, such as a one-chip microcomputer, includes a power-supply-potential detecting circuit (9) which, when the power supply potential ($V_{CC}$) becomes lower than a predetermined value ($V_D$), generates a reset signal (RST) to reset, i.e., initialize the one-chip device. A reset signal inhibiting circuit (10, 11) is provided to inhibit the transmission of the reset signal during the check mode.

24 Claims, 17 Drawing Figures

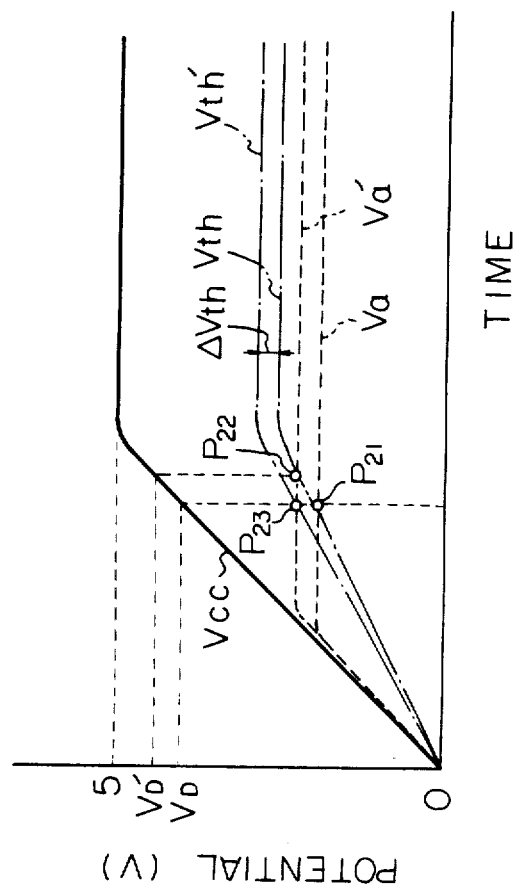

4,551,841

ONE-CHIP SEMICONDUCTOR DEVICE INCORPORATING A POWER-SUPPLY-POTENTIAL DETECTING CIRCUIT WITH RESET FUNCTION

BACKGROUND OF THE INVENTION (1) Field of the Invention

The present invention relates to a one-chip semiconductor device such as a one-chip microcomputer incorporating a power-supply-potential detecting circuit for resetting the device when the power supply potential is lower than a predetermined value.

(2) Description of the Prior Art

In a semiconductor device or integrated circuit such as a one-chip microcomputer, if the rated power supply potential is 5 V, the device normally operates at its rated accuracy in the range of ±5% to ±10% of the rated potential. When the power supply potential deviates from the above-mentioned range, the device may perform a logically erroneous operation and may overrun.

To prevent the device from erroneously operating, a power-supply-potential detecting circuit is provided. When the power supply potential becomes lower than a detection potential of the circuit, the circuit generates a signal for resetting the device.

In a one-chip semiconductor device incorporating such a power-supply-potential detecting circuit, it is naturally checked whether the device operates normally in the predetermined range of the rated power supply potential. In addition, it is necessary to check whether the device operates normally when the power supply potential is between the lower limit of the above-mentioned range and the detection potential, since customers may use the device below the lower limit.

In the above-mentioned one-chip semiconductor device incorporating such a power-supply-potential detecting circuit, however, there is an area between the lower limit of the above-mentioned range and the detection potential of the power-supply-potential detecting circuit which cannot be checked. For example, if the detection potential of the circuit is about 4.0 V, the circuit can check whether the device operates normally only when the power supply potential is higher than, 4.1 V due to the manufacturing fluctuation. That is, the area between 4.0 V to 4.1 V cannot be checked.

SUMMARY OF THE INVENTION

It is an object of the present invention to provide a one-chip semiconductor device incorporating a power-supply-potential detecting circuit, in which it is possible to check whether the device operates normally when the power supply potential is equal to or higher than the detection potential of the circuit.

It is another object of the present invention to provide improved power-supply-potential detecting circuits use with a one-chip semiconductor device.

According to the present invention, a circuit is provided for inhibiting transmission of a reset signal from a power-supply-potential detecting circuit even when the power supply potential becomes lower than the detection potential of the circuit. That is, such an inhibiting circuit is operated during the check mode so that the device is not reset.

The present invention will be more clearly understood from the description as set forth below with reference to the accompanying drawings.

BRIEF DESCRIPTION OF THE DRAWINGS

FIG. 17 is a waveform diagram of the signals of the circuit of FIG. 16.

DESCRIPTION OF THE PREFERRED EMBODIMENTS

Figure 1:
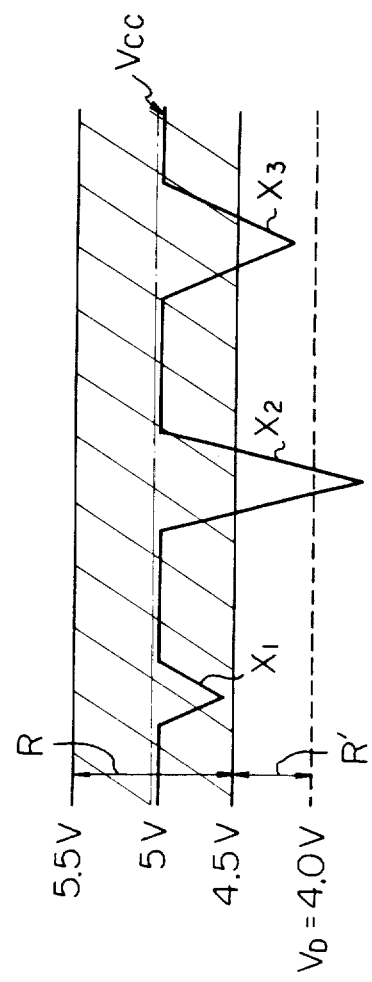
FIG. 1 is a diagram of the voltage waveforms during a reset operation of a one-chip semiconductor device incorporating a power-supply-potential detecting circuit.

First, the reset operation of a one-chip semiconductor device incorporating a power-supply-potential detecting circuit will be explained with reference to FIG. 1. In FIG. 1, $V_{CC}$ designates a power supply potential, and $V_D$ designates a predetermined detection potential. Here, it is assumed that the rated potential of the power supply $V_{CC}$ is 5 V and its allowance or range R is 4.5 to 5.5 V, as indicated by the shaded portion. If the power supply potential $V_{CC}$ deviates from the range R, it may be necessary to reset the device so that a logically-erroneous operation is not performed. For this purpose, it is preferable that the detection potential $V_D$ always be consistent with the lower limit of the range R, i.e., 4.5 V. Actually, the detection potential $V_D$ is, however, set lower than the lower limit in view of manufacturing fluctuations. For example, the detection potential $V_D$ is set at 4.0 V, as shown in FIG. 1.

During the test or check mode, first, the device is checked for normal operation when the power supply potential $V_{CC}$ is within the range R. Second, the device is checked for whether a reset operation is performed when the power supply potential $V_{CC}$ reaches the detection potential $V_D$. That is, as illustrated by $X_1$ in FIG. 1, it is checked whether the device normally operates when the power supply potential $V_{CC}$ is within the range R. In addition, as illustrated by $X_2$ in FIG. 1, it is checked whether a reset operation is performed when the power supply potential $V_{CC}$ becomes lower than the detection potential $V_D$.

It should be also noted that customers may use the above-mentioned semiconductor device within a range R' between the lower limit of the rated range R and the detection potential $V_D$. Therefore, it is necessary to check whether the device normally operates when the power supply potential $V_{CC}$ is within the range R' as indicated by $X_3$ in FIG. 1. However, due to the presence of the detection potential $V_D$, it is not completely possible to check whether the device normally operates within the range R' in the proximity of $V_D$, since a reset operation may be performed.

According to the present invention, it is possible to check whether the device normally operates within the entire range R' as well as the range R.

Figure 2:
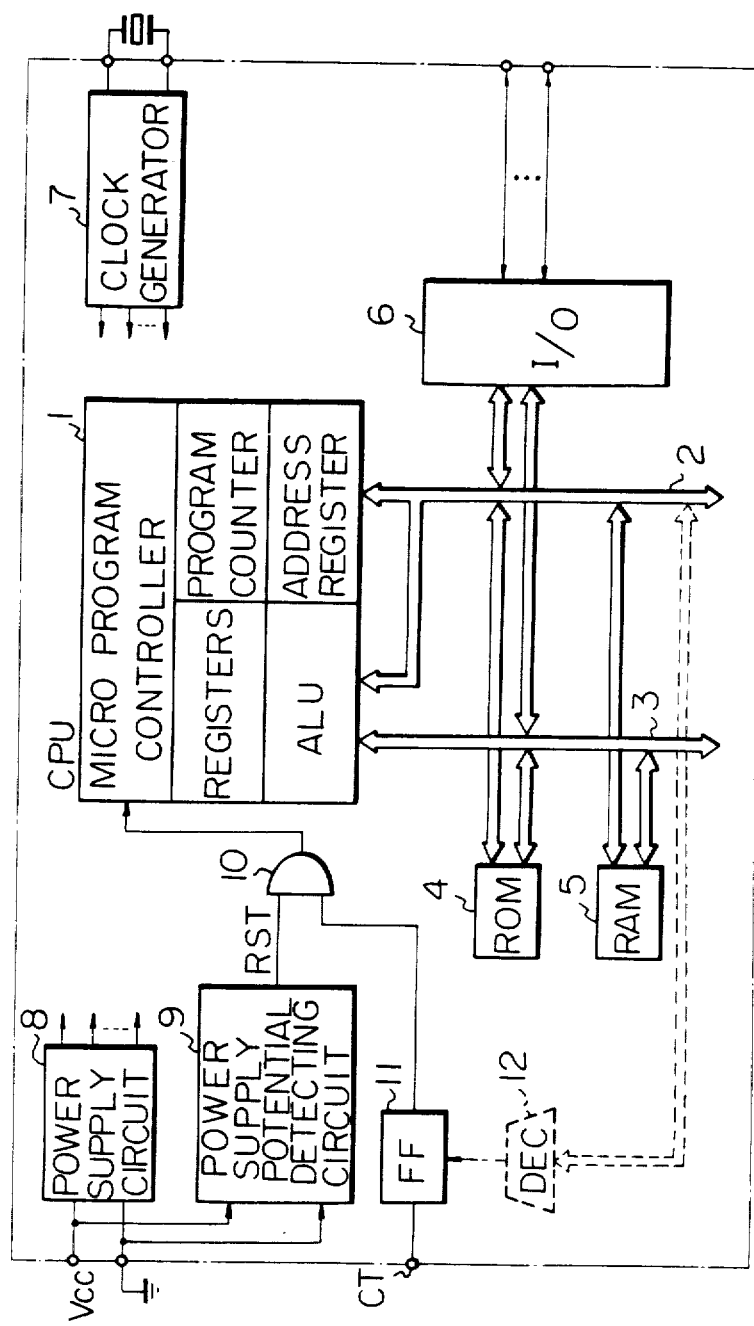
FIG. 2 is a block diagram of an emobodiment of the one-chip semiconductor device incorporating a power-supply-potential detecting circuit according to the present invention.

In FIG. 2, which is an embodiment of the present invention, a one-chip microcomputer is illustrated. The one-chip microcomputer comprises a central processing unit 1 (CPU) including a micro program controller, registers, such as a command register and a data register; an arithmetic logic unit (ALU) connected to the registers for performing an arithmetic logic operation; an address counter; an address register connected to the address counter; and the like.

The one-chip microcomputer further comprises an address bus 2, a data bus 3, a read-only memory (ROM) 4 for storing program sequences, constants, etc., a random access memory (RAM) 5 for storing temporary data, input/output (I/O) interfaces 6, a clock generator 7 for generating interruption signals, etc., a power supply circuit 8 for applying power potentials to each portion of the microcomputer, a power-supply-potential detecting circuit 9, an AND circuit 10, and a flip-flop 11.

In the microcomputer illustrated in FIG. 2, when the power supply potential $V_{CC}$ temporarily becomes lower than the power limit allowance thereof, the content of the RAM 5 may be inverted from "1" to "0" or vice versa. In addition, the contents of the registers and the program counter of the CPU 1 may be changed. In this case, although the microcomputer continues to operate without changing its appearance, the program may overrun, so that the following operation will not be guaranteed.

The above-mentioned state in which program overruns are generated can be avoided by the power-supply-potential detecting circuit 9. That is, the power-supply-potenital detecting circuit 9 detects the power supply potential $V_{CC}$ and generates a reset signal RST when the power supply potential $V_{CC}$ becomes lower than a predetermined detection potential $V_D$. Upon receipt of the reset signal RST through the AND circuit 10, the micro program controller of the CPU 1 resets, i.e., initializes the registers and the program counter thereof by using a clock signal of the clock generator 7. Thus, the microcomputer is initialized to restart the operation from the beginning.

The AND circuit 10 and the flip-flop 11 are provided for inhibiting the transmission of the reset signal RST of the power-supply-potential detecting circuit 9 during the check mode. That is, during the check mode, a control signal is supplied from a check-mode terminal CT so as to reset the flip-flop 11, which, in turn, generates a low-potential signal "0". As a result, the AND circuit 10 inhibits the transmission of the reset signal RST of the power-supply-potential detecting circuit 9. During the usual mode, another control signal is supplied from the check terminal CT so as to set the flip-flop 11 which, in turn, generates a high-potential signal "1". As a result, the reset signal RST of the power-supply-potential detecting circuit 9 is transmitted through the AND circuit 10 to the micro program controller of the CPU 1, thereby resetting the registers and the program counter thereof.

Thus, during the check mode, it is possible to check whether the one-chip microcomputer normally operates even when the power supply potential $V_{CC}$ is lower than the detection potential $V_D$.

In the embodiment, note that the flip-flop 11 can be omitted. In this case, a control signal having a low potential or a high potential is transmitted directly to the AND circuit 10.

The check-mode terminal CT can also be omitted. In this case, a decoder 12 is provided. The CPU 1 generates a specified address so that the decoder 12 resets the flip-flop 11. As a result, the transmission of the reset signal RST is inhibited. After the check mode, the CPU 1 sets the flip-flop 11.

In addition, in order to reset the device from the exterior, a reset terminal and an OR circuit is provided between the output of the AND circuit 10 and the CPU 1. In this case, a reset signal is supplied from the reset terminal via the OR circuit to the CPU 1.

The power-supply-potential detecting circuit 9 will now be explained in more detail with reference to FIGS. 3 through 17.

Figure 3:
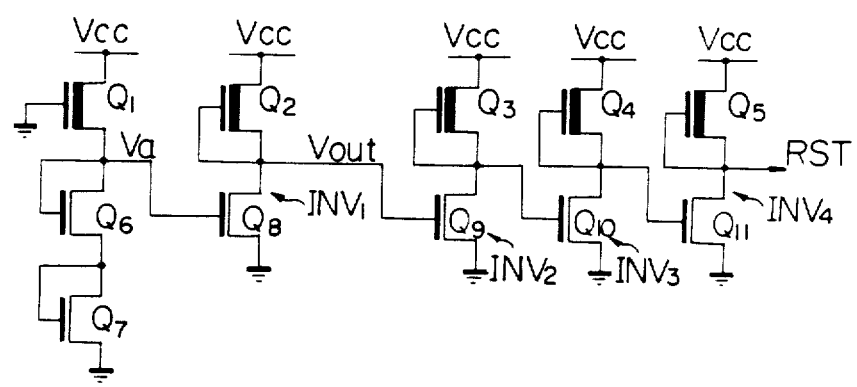
FIG. 3 is a circuit diagram of a first example of the power-supply-potential detecting circuit of FIG. 2.

In FIG. 3, an enhancement/depletion (E/D) MOS circuit is used. That is, the power-supply-potential detecting circuit 9 comprises depletion-type MOS transistors $Q_1$ through $Q_5$ and enhancement-type MOS transistors $Q_6$ through $Q_{11}$. The gate of the transistor $Q_1$ is grounded, and, accordingly, transistor $Q_1$ serves as a resistance. The transistors $Q_6$ and $Q_7$ have gates connected to the drains thereof and, accordingly, serve as MOS diodes. The serial configuration of the two transistors $Q_6$ and $Q_9$ is helpful in effectively driving the following stage transistor $Q_8$ which, in combination with the transistor $Q_2$, forms an inverter $INV_1$.

The following transistors $Q_3$ and $Q_9$, $Q_4$ and $Q_{10}$, and $Q_5$ and $Q_{11}$ also form inverters $INV_2$, $INV_3$, $INV_4$, respectively, which are, however, used for shaping the output $V_{out}$ of the inverter $INV_1$ so as to generate a reset signal RST.

Note that the threshold potential of the inverter $INV_1$ is the same as the threshold potential $V_{th}$ of the transistor $Q_8$.

Figure 4:
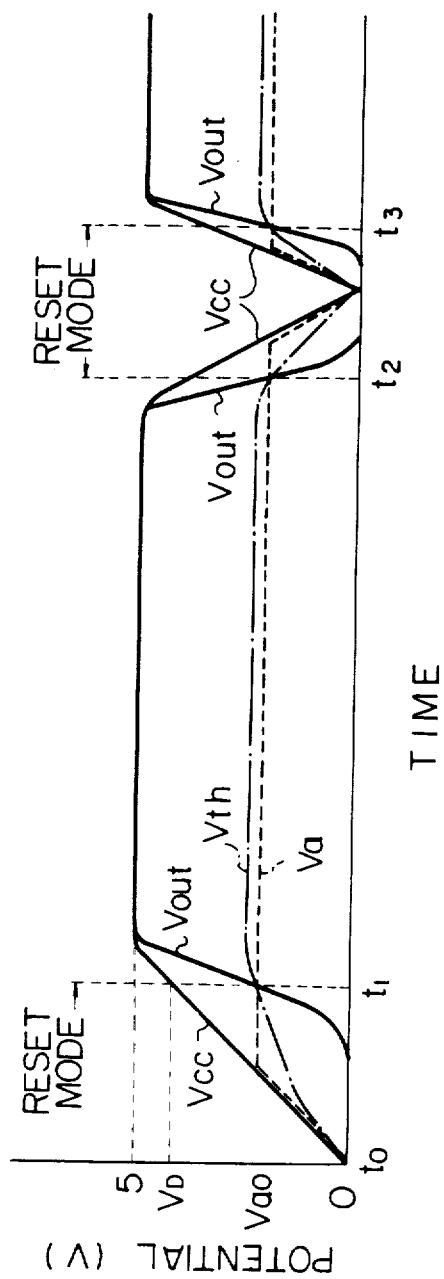
FIG. 4 is a waveform diagram of the signals of the circuit of FIG. 3.

As illustrated in FIG. 4, when the power supply potential $V_{CC}$ is low, the transistors $Q_6$ and $Q_7$ are cut off, so that the potential $V_a$ follows the power supply potential $V_{CC}$. In addition, when the power supply potential $V_{CC}$ becomes higher than the threshold potential of the transistor $Q_6$ plus that of the transistor $Q_7$, the potential $V_a$ is a definite value $V_{a0}$ in accordance with the potential characteristics of the MOS diodes. Since the saturation characteristics of the potential $V_a$ are better when the load transistor $Q_1$ has a larger resistance, it is preferable that the conductance $g_m$ of the transistor $Q_1$ be small. In the inverter $INV_1$ receiving the potential $V_a$, since its threshold potential $V_{th}$ is dependent on the power supply potential $V_{CC}$, the potential $V_a$ intersects the threshold potential $V_{th}$ of the inverter INV$_1$ at the times t$_1$, t$_2$, and t$_3$, so that the output V$_{out}$ of the inverter INV$_1$ is changed from high to low or vice versa. Thus, a reduction of the power supply potential V$_{CC}$ can be detected. Accordingly, when the output V$_{out}$ of the inverter INV$_1$ is shaped by the following inverters INV$_2$, INV$_3$, and INV$_4$, a stepwise reset signal RST is obtained.

Note that the value of the power supply potential V$_{CC}$ at the time t$_1$, t$_2$, or t$_3$ is called a detection potential V$_D$, which is, for example, 4 V.

Figure 5:
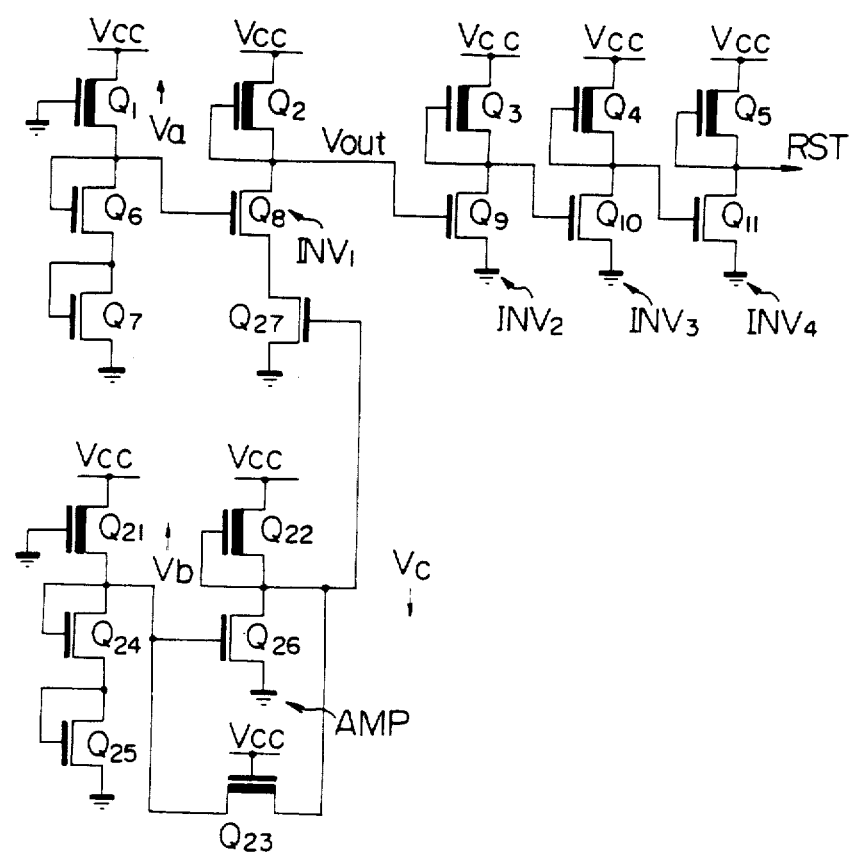
FIG. 5 is a circuit diagram of a second example of the power-supply-potential detecting circuit of FIG. 2.

In FIG. 5, depletion-type transistors Q$_{21}$, Q$_{22}$ and Q$_{23}$ and enhancement-type transistors Q$_{24}$, Q$_{25}$, Q$_{26}$, and Q$_{27}$ are added to the elements of FIG. 3, so as to compensate for manufacturing fluctuation. The transistors Q$_{21}$, Q$_{24}$, and Q$_{25}$ have the same characteristics as those of the transistors Q$_1$, Q$_6$, and Q$_7$, respectively. Therefore, the potential V$_b$ is about the same as the potential V$_a$. The transistors Q$_{22}$, Q$_{23}$, and Q$_{26}$ form an inverting-amplifier AMP. In this case, the transistor Q$_{23}$ is a feedback resistance. Accordingly, the gain of the inverting-amplifier AMP is set by the feedback resistance transistor Q$_{23}$. Further, the transistor Q$_{27}$ is interposed between the source of the transistor Q$_8$ and ground, so that the threshold potential V$_{th}$ of the inverter INV$_1$ is also controlled by the conductance g$_m$ of the transistor Q$_{27}$, which is controlled by the output V$_c$ of the inverting-amplifier AMP.

Figure 6:
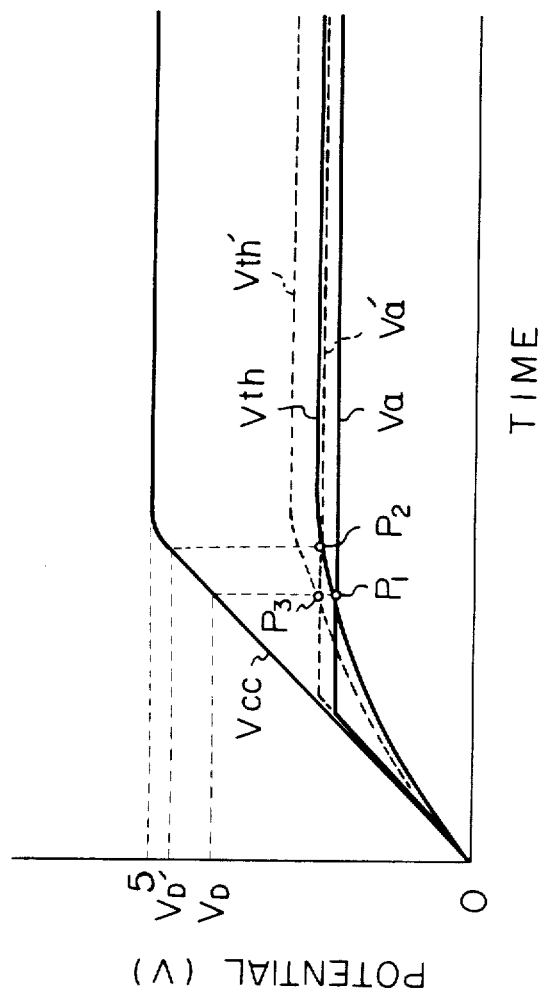
FIG. 6 is a waveform diagram of the signals of the circuit of FIG. 5.

Referring to FIG. 6, when the potential V$_a$ rises up to V$_a$' due to manufacturing fluctuation of the transistors Q$_1$, Q$_6$, and Q$_7$, the intersecting point is moved from P$_1$ to P$_2$ if the threshold potential V$_{th}$ of the inverter INV$_1$ remains unchanged, so that the detection potential is also moved from V$_D$ to V$_D$'. However, in FIG. 5, the potential V$_b$ changes in the same way as the potential V$_a$ and, accordingly, the potential V$_c$ of the inverting-amplifier AMP changes in the opposite direction of the potential V$_a$. Therefore, if the potential V$_a$ rises, the potential V$_c$ falls so as to reduce the conductance g$_m$ of the transistor Q$_{27}$, i.e., to increase the threshold potential V$_{th}$ of the inverter INV$_1$. As a result, the intersecting point is actually moved from P$_1$ to P$_3$, so that the detection potential remains at V$_D$.

In FIG. 5, note that the gate of the transistor Q$_{26}$ can be also connected directly to the source of the transistor Q$_1$. In this case, the transistors Q$_{21}$, Q$_{24}$, and Q$_{25}$ are omitted.

Figure 7:
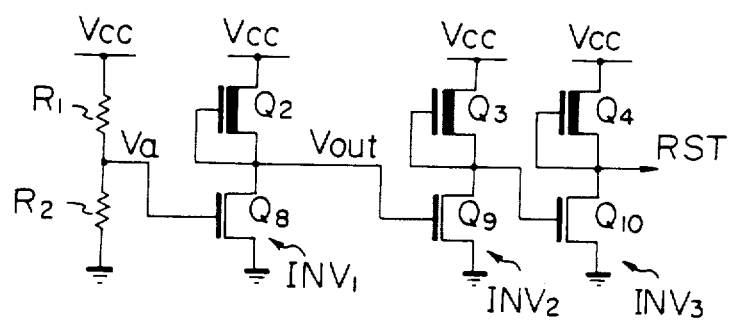
FIG. 7 is a circuit diagram of a third example of the power-supply-potential detecting circuit of FIG. 2.
Figure 8:
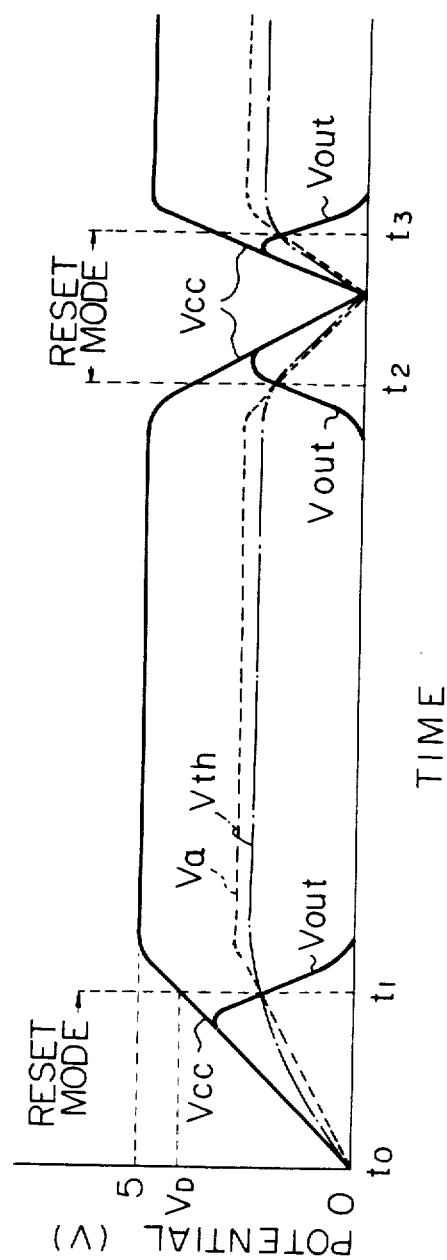
FIG. 8 is a waveform diagram of the signals of the circuit of FIG. 7.

In FIG. 7, resistors R$_1$ and R$_2$ are provided instead of the transistors Q$_1$, Q$_6$, and Q$_7$ of FIG. 3. In addition, the inverter INV$_4$ of FIG. 3 is omitted. In this case, the output V$_{out}$ of the inverter INV$_1$ changes as shown in FIG. 8 in the opposite way as in FIG. 4.

Figure 9:
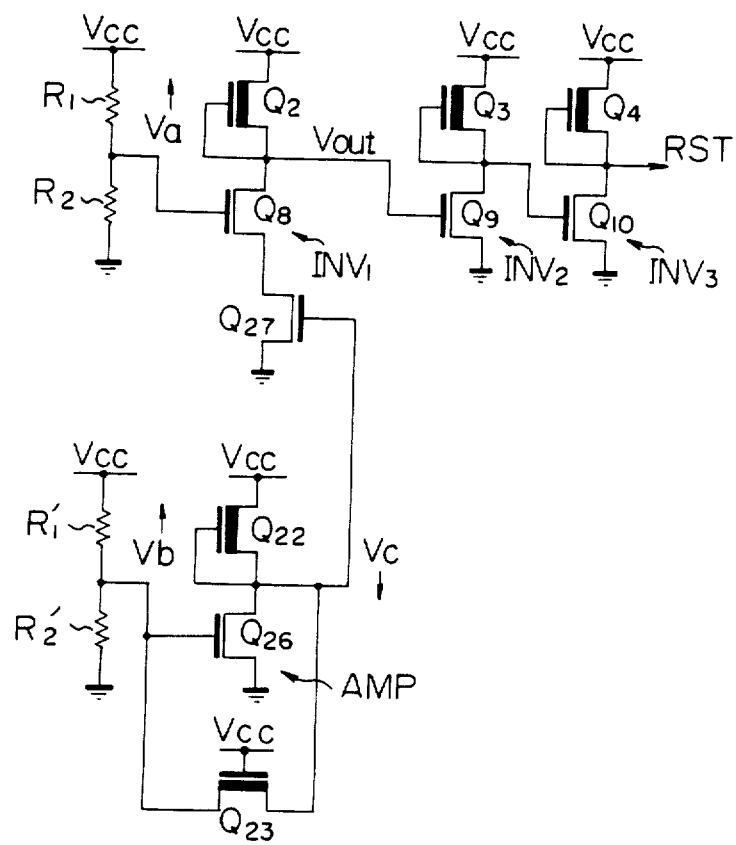
FIG. 9 is a circuit diagram of a fourth example of the power-supply-potential detecting circuit of FIG. 2.

In FIG. 9, resistors R$_1$' and R$_2$', and the transistors Q$_{22}$, Q$_{23}$, Q$_{26}$, and Q$_{27}$ are added to the elements of FIG. 7, so as to compensate for the manufacturing fluctuation of the circuit of FIG. 7. That is, the circuits of FIGS. 7 and 9 correspond to the circuits of FIGS. 3 and 5, respectively.

Figure 10:
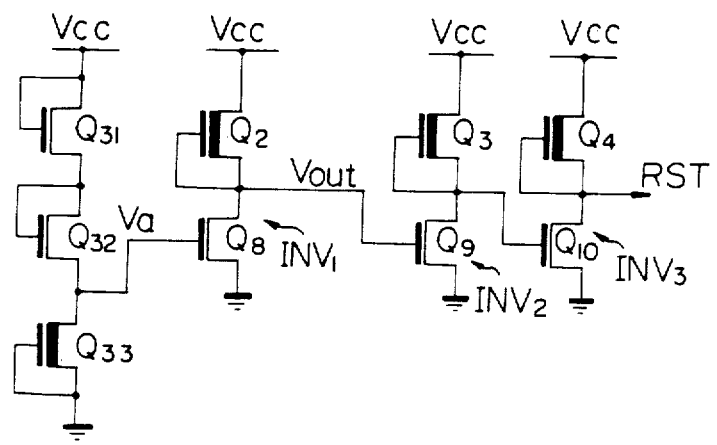
FIG. 10 is a circuit diagram of a fifth example of the power-supply-potential detecting circuit of FIG. 2.

In FIG. 10, enhancement-type transistors Q$_{31}$ and Q$_{32}$ and a depletion-type transistor Q$_{33}$ are provided instead of the resistors R$_1$ and R$_2$ of FIG. 7. The transistors Q$_{31}$ and Q$_{32}$ have gates connected to the drains thereof and, accordingly, serve as MOS diodes, while the transistor Q$_{33}$ has a gate connected to he source thereof and, accordingly, serves as a load.

Figure 11:
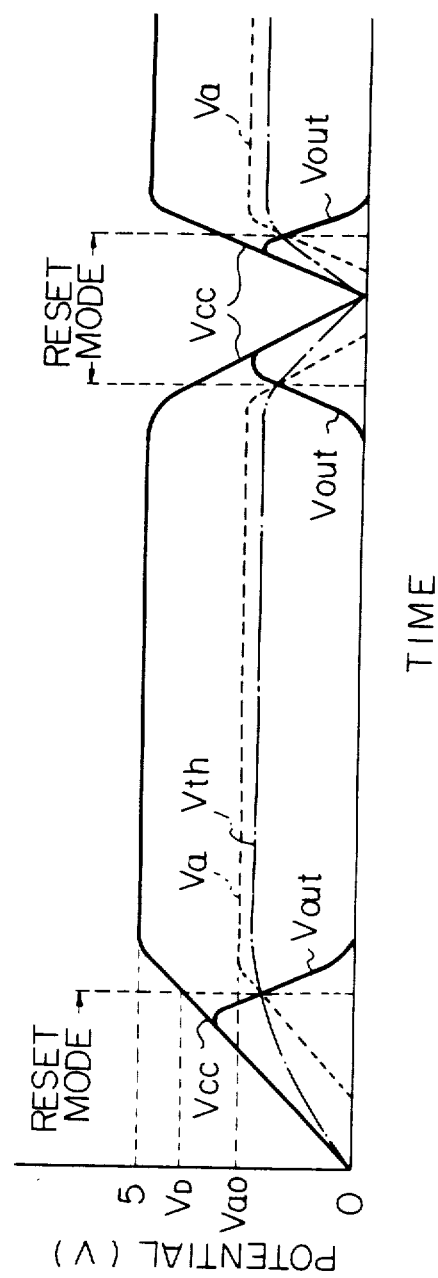
FIG. 11 is a waveform diagram of the signals of the circuit of FIG. 10.

As illustrated in FIG. 11, when the power supply potential V$_{cc}$ is low, the transistors Q$_{31}$ and Q$_{32}$ are cut off, so that the potential V$_a$ remains at the ground potential. In addition, when the power supply potential V$_{CC}$ becomes higher than the threshold potential of the transistor Q$_{31}$ plus that of the transistor Q$_{32}$, the potential V$_a$ is a definite value V$_{a0}$ in accordance with the MOS diode characteristics. In this case, it is also preferable that the conductance g$_m$ of the transistor Q$_{33}$ be small. Thus, the output V$_{out}$ of the inverter INV$_1$ changes in the same way as in FIG. 8.

Figure 12:
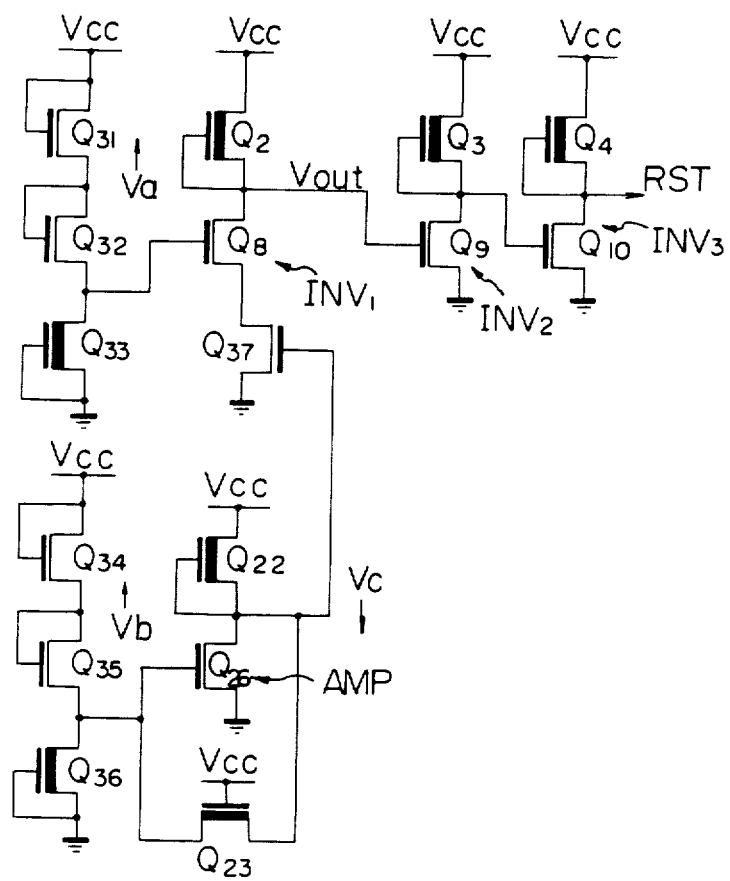
FIG. 12 is a circuit diagram of a sixth example of the power-supply-potential detecting circuit of FIG. 2.

In FIG. 12, enhancement-type transistors Q$_{34}$ and Q$_{35}$ and a depletion-type transistor Q$_{36}$ are provided instead of the resistors R$_1$' and R$_2$' of FIG. 9, so as to compensate for the manufacturing fluctuation of the circuit of FIG. 10.

Figure 13:
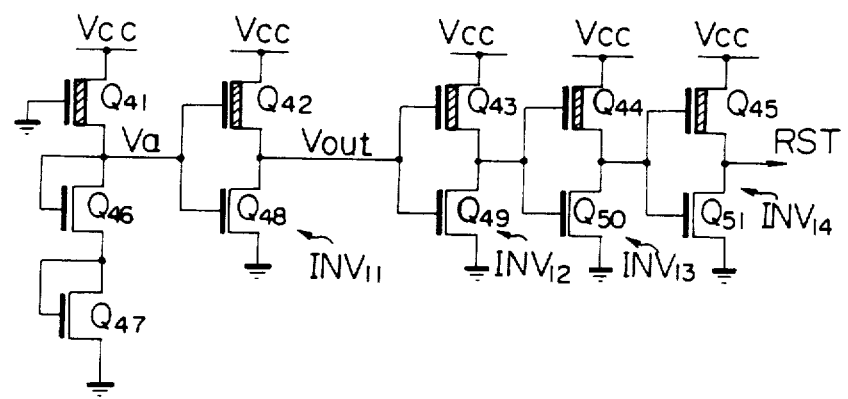
FIG. 13 is a circuit diagram of a seventh example of the power-supply-potential detecting circuit of FIG. 2.

In FIG. 13, a CMOS circuit is used. That is, the power-supply-potential detecting circuit 9 comprises P-channel transistors Q$_{41}$ through Q$_{45}$ and N-channel transistors Q$_{46}$ through Q$_{51}$. The gate of the transistor Q$_{41}$ is grounded and, accordingly, this transistor Q$_{41}$ serves as a resistance. The transistors Q$_{46}$ and Q$_{47}$ have gates connected to the drains thereof and, accordingly, serve as MOS diodes. The serial configuration of the two transistors Q$_{46}$ and Q$_{47}$ is also helpful in effectively driving the following stage CMOS inverter INV$_{11}$ formed by the transistors Q$_{42}$ and Q$_{48}$.

The transistors Q$_{43}$ and Q$_{49}$, Q$_{44}$ and Q$_{50}$, and Q$_{45}$ and Q$_{51}$ also form CMOS inverters INV$_{12}$, INV$_{13}$, and INV$_{14}$, respectively, which are used for shaping the output V$_{out}$ of the inverter INV$_{11}$ so as to generate a reset signal RST.

Figure 14:
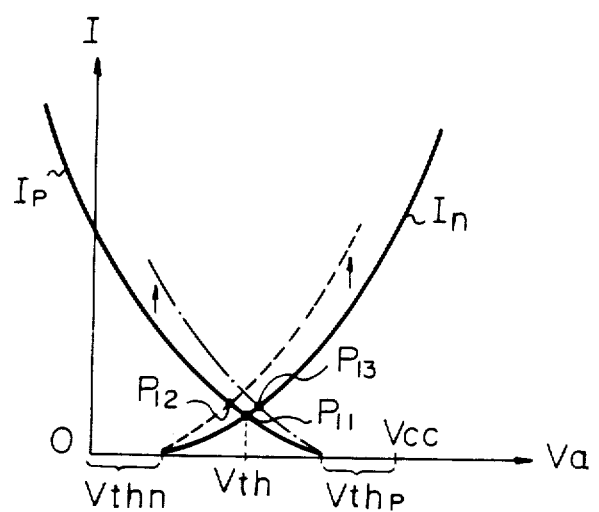
FIG. 14 is a diagram of the threshold potential $V_{th}$ of a complementary metal oxide semiconductor (CMOS) inverter.

Note that the threshold potential V$_{th}$ of a standard CMOS inverter is half of the power supply potential V$_{CC}$, i.e., V$_{CC}$/2, which will be explained with reference to FIG. 14. In FIG. 14, the ordinate represents a current I, while the abscissa represents a potential such as the potential V$_a$ of FIG. 13. V$_{thn}$ is the threshold potential of the N-channel transistor Q$_{48}$, while V$_{thp}$ is the threshold potential of the P-channel transistor Q$_{42}$. If the inverter INV$_{11}$ is a standard CMOS inverter, V$_a$ equals the threshold potential V$_{th}$ when the current I$_p$ flowing through the P-channel transistor Q$_{42}$ is the same as the current I$_n$ flowing through the N-channel transistor Q$_{48}$. That is, if $|V_{thn}| = |V_{thp}|$ and the current I$_n$ has the same characteristics as the current I$_p$, V$_{th}$ is always V$_{CC}$/2 even when the power supply potential V$_{CC}$ is changed.

Figure 15:
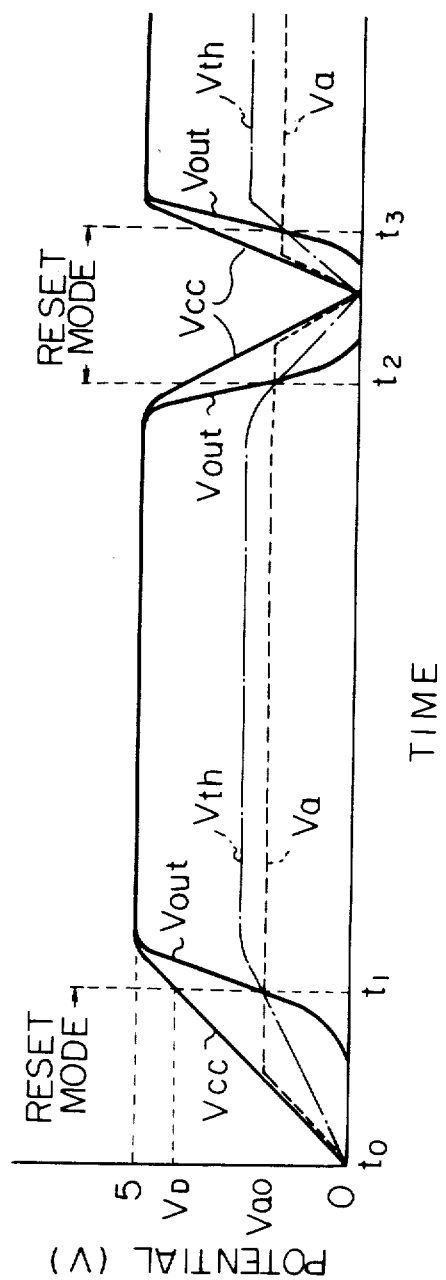
FIG. 15 is a waveform diagram of the signals of the circuit of FIG. 13.

Therefore, as illustrated in FIG. 15, after the potential V$_a$ reaches a predetermined value V$_{a0}$ due to the fact that the gate-to-source potential of each of the transistors Q$_{46}$ and Q$_{47}$ is definite, the transistor Q$_{48}$ has approximately the same conductance. However, even when the potential V$_a$ is definite, the transistor Q$_{42}$ becomes more forward biased as the power supply potential V$_{CC}$ rises. As a result, the conductance of the transistor Q$_{42}$ becomes large, and, accordingly, the output V$_{out}$ is pulled up at the time t$_1$. Even in this case, since the transistor Q$_{48}$ remains conductive, the change of the output V$_{out}$ of the inverter INV$_{11}$ is slow. Therefore, the following inverters INV$_{12}$, INV$_{13}$, and INV$_{14}$ shape the output V$_{out}$ so as to generate a stepwise reset signal RST.

Note that the threshold potential V$_{th}$ of the CMOS inverter such as INV$_{11}$ can be changed by changing the size of the P-channel transistor Q$_{42}$ or the N-channel transistor Q$_{47}$. For example, when the size of the N-channel transistor Q$_{47}$ is increased, the current I$_n$ flowing therethrough is increased as indicated by a dotted line in FIG. 14. As a result, the intersecting point is moved from P$_{11}$ to P$_{12}$, so as to reduce the threshold potential V$_{th}$. Therefore, the detection potential V$_D$ is also reduced. However, when the size of the P-channel transistor $Q_{42}$ is increased, the current $I_p$ flowing therethrough is increased as indicated by a dash-dotted line in FIG. 14. As a result, the intersecting point is moved from $P_{11}$ to $P_{13}$, so as to increase the threshold potential $V_{th}$. Therefore, the detection potential $V_D$ is also increased. Thus, the threshold potential $V_{th}$ can be arbitrarily set within $V_{thn}$ to ($V_{CC}-V_{thp}$) in FIG. 4, so as to obtain a desired value of $V_D$.

Figure 16:
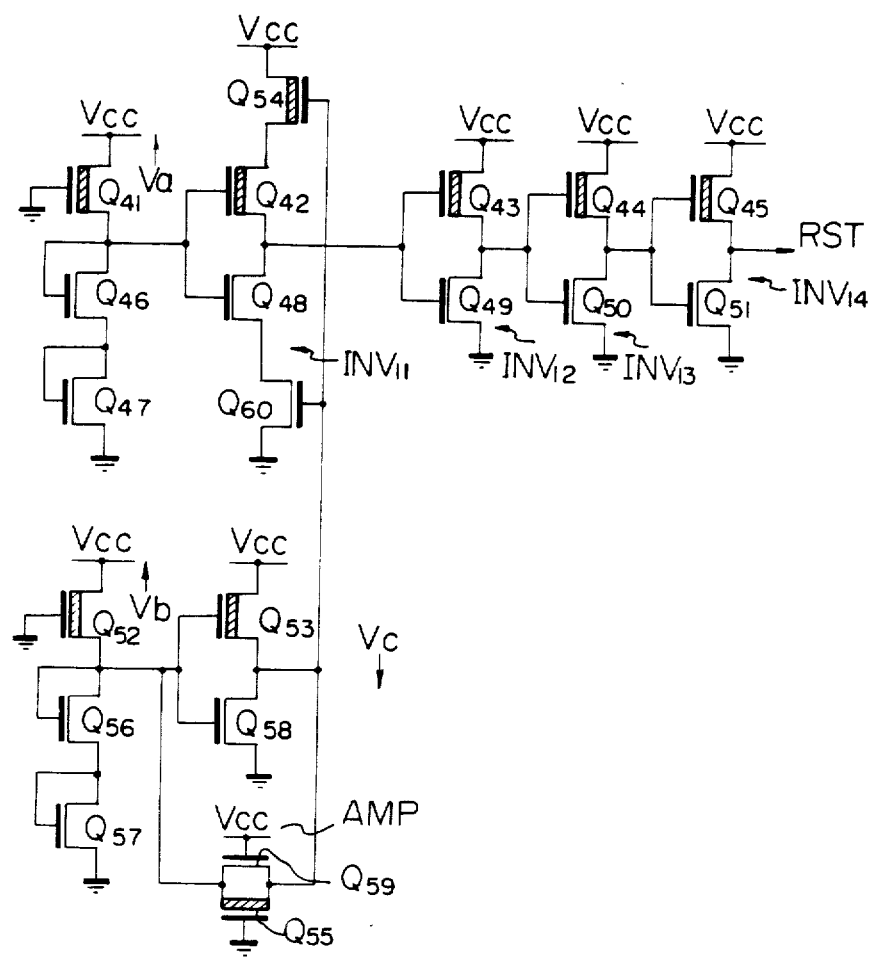
FIG. 16 is a circuit diagram of an eighth example of the power-supply-potential detecting circuit of FIG. 2.

In FIG. 16, P-channel transistors $Q_{52}$ through $Q_{54}$ and N-channel transistors $Q_{56}$ through $Q_{60}$ are added to the elements of FIG. 13, so as to compensate for the manufacturing fluctuation of the circuit of FIG. 13, especially the manufacturing fluctuation of the transistors $Q_{46}$ and $Q_{47}$. If the threshold potential of each of the transistors $Q_{46}$ and $Q_{47}$ is changed by 10%, the potential $V_a$ is changed as indicated by $V_a'$ in FIG. 17. In this state, if the threshold potential $V_{th}$ of the inverter $INV_{11}$ remains unchanged, the intersecting point is moved from $P_{21}$ to $P_{22}$, so that the detection potential is also moved from $V_D$ to $V_D'$. In FIG. 16, however, the added transistors $Q_{52}$ through $Q_{60}$ increase the threshold potential $V_{th}$, so that the intersecting point is actually moved from $P_{21}$ to $P_{23}$. Therefore, the detection potential $V_D$ remains at $V_D$.

The transistors $Q_{52}$, $Q_{56}$, and $Q_{57}$ have the same characteristics as those of the transistors $Q_{41}$, $Q_{46}$, and $Q_{47}$, respectively. Therefore, the potential $V_b$ is the same as the potential $V_a$. The transistors $Q_{53}$, $Q_{58}$, $Q_{59}$, and $Q_{55}$ form an inverting-amplifier AMP. In this case, the transistors $Q_{59}$ and $Q_{55}$ in combination form a feedback resistance and, accordingly, the gain of the inverting-amplifier AMP is set by this feedback resistance. Further, the transistor $Q_{54}$ is interposed between the power supply $V_{cc}$ and the drain of the transistor $Q_{42}$, and the transistor $Q_{60}$ is interposed between the source of the transistor $Q_{48}$ and ground. The gates of these transistors $Q_{54}$ and $Q_{60}$ are commonly controlled by the output $V_c$ of the inverting-amplifier AMP.

Referring to FIG. 17, when the potential $V_a$ rises up to $V_a'$ due to the manufacturing fluctuation of the transistors $Q_{41}$, $Q_{46}$, and $Q_{47}$, the intersecting point is moved from $P_{21}$ to $P_{22}$ if the threshold potential $V_{th}$ of the inverter $INV_{11}$ remains unchanged, so that the detection point is also moved from $V_D$ to $V_D'$. However, in FIG. 16, the potential $V_b$ changes in the same way as the potential $V_a$ and, accordingly, the potential $V_c$ of the inverting-amplifier AMP changes in the opposite direction of the potential $V_a$. Since the potential $V_b$ is applied to the transistors $Q_{54}$ and $Q_{60}$, the conductance $g_m$ of the transistor $Q_{54}$ is reduced, while the conductance of the transistor $Q_{60}$ is increased. As a result, the resistance on the P-channel transistors $Q_{54}$ and $Q_{42}$ is reduced, while the resistance on the N-channel transistors $Q_{48}$ and $Q_{60}$ is increased. That is, the slope of the current $I_p$ becomes large, while the slope of the current $I_n$ becomes small, so that the intersecting point (FIG. 14) of the current $I_p$ and $I_n$ is moved to the right side. Thus, the threshold potential of the inverter $INV_{11}$ is moved from $V_{th}$ to $V_{th}'$, so that the intersecting point of the threshold potential of the inverter $INV_{11}$ and the output $V_a$ is moved from $P_{21}$ to $P_{23}$. Thus, the detection potential is stabilized at $V_D$.

Note that the increase $\Delta V_{th}$ from $V_{th}$ to $V_{th}'$ is adjusted by the gain of the inverting-amplifier AMP or the parameters of the transistors $Q_{54}$ and $Q_{60}$. In addition, the fluctuation of the threshold potential $V_{th}$ of the inverter $INV_{11}$ due to the transistors thereof invites the change of the slope of $V_{th}$, which is, not as large as that due to the manufacturing fluctuation of the transistors $Q_{41}$, $Q_{46}$, and $Q_{47}$. In view of both of the changes, the feedback resistance formed by the transistors $Q_{59}$ and $Q_{55}$ and the like are adjusted.

In FIG. 16, the input of the inverting-amplifier AMP can be also connected directly to the source of the transistor $Q_{41}$ so as to omit the transistors $Q_{52}$, $Q_{56}$, and $Q_{57}$.

As explained hereinbefore, the present invention has an advantage in that it is completely possible to check whether or not the one-chip semiconductor device incorporating a power-supply-potential detecting circuit operates normally.

We claim:

1. A semiconductor device having a check mode comprising:
   first and second power supply terminals, the potential of said first power supply terminal being higher than the potential of said second power supply terminal;
   an internal circuit, operatively connected to said first and second power supply terminals, for receiving the potentials of said first and second power supply terminals;
   a power-supply-potential detecting circuit, operatively connected to said first and second power supply terminals and to said internal circuit, for detecting the potential at said first power supply terminal and generating a reset signal for resetting said internal circuit when the potential at said first power supply terminal is lower than a predetermined value;
   a reset signal inhibiting circuit having a first input operatively connected to said power-supply-potential detecting circuit for receiving said rest signal, having a second input for receiving a control signal, and having an output operatively connected to said internal circuit, said reset signal inhibiting circuit inhibiting the transmission of said reset signal when receiving said control signal; and
   generating means, operatively connected to said reset signal inhibiting circuit, for detecting the check mode and for generating said control signal in response to detecting the check mode.

2. A device as set forth in claim 1, wherein said power-supply-potential detecting circuit has an output and wherein said generating means comprises:
   a check-mode terminal; and
   a flip-flop, operatively connected to said check-mode terminal, being set and reset by the potential at said check-mode terminal and having an output, and wherein
   said reset signal inhibiting circuit comprises an AND circuit having a first input operatively connected to the output of said power-supply-potential detecting circuit, having a second input operatively connected to the output of said flip-flop, and having an output operatively connected to said internal circuit.

3. A device as set forth in claim 1, wherein said power-supply-potential detecting circuit has an output and said generating means comprises a check-mode terminal, and wherein said reset signal detecting circuit comprises an AND circuit having a first input operatively connected to the output of said power-supply-potential detecting circuit, having a second input operatively connected to said check-mode terminal, and having an output operatively connected to said internal circuit.

4. A device as set forth in claim 1, wherein said power-supply-potential detecting circuit comprises:
   load means operatively connected to said first power supply terminal;
   diode means operatively connected to said load means and to said second power supply terminal;
   inverter means operatively connected to said first and second power supply terminals, said inverter means having an input connected to the connection point between said load means and said diode means, and having an output; and
   waveform shaping means, operatively connected to said first and second power supply terminals and to the output of said inverter means, for shaping the waveform of the output of said inverter means to generate said reset signal.

5. A device as set forth in claim 4,
   wherein said load means comprises a first depletion-type transistor having a drain operatively connected to said first power supply terminal, having a gate operatively connected to said second power supply terminal and having a source,
   wherein said diode means comprises at least one first enhancement-type transistor having a gate, having a drain operatively connected to the gate and to the source of said first depletion-type transistor, and having a source operatively connected to second power supply terminal, and
   wherein said inverter means comprises:
   a second depletion-type transistor having a drain operatively connected to said first power supply terminal, having a source, and having a gate operatively connected to the source; and
   a second enhancement-type transistor having a drain operatively connected to the source of said second depletion-type transistor.

6. A device as set forth in claim 5, wherein said inverter means further comprises a third enhancement-type transistor operatively connected between the source of said second enhancement-type transistor and said second power supply terminal, said device further comprising controlling means for controlling the conductance of said third enhancement-type transistor.

7. A device as set forth in claim 6, wherein said controlling means comprises:
   load means operatively connected to said first power supply terminal;
   diode means operatively connected to said load means and to said second power supply terminal; and
   inverting-amplifier means operatively connected to said first and second power supply terminals, said inverting-amplifier means having an input operatively connected to the connection point of said load means and said diode means and having an output operatively connected to the gate of said third enhancement-type transistor.

8. A device as set forth in claim 6, wherein said controlling means comprises inverting-amplifier means operatively connected to said first and second power supply terminals, said inverting-amplifier means having an input operatively connected to said load means and having an output operatively connected to the gate of said third enhancement type transistor.

9. A device as set forth in claim 4, wherein said load means comprises a P-channel transistor having a drain operatively connected to said first power supply terminal, having a gate operatively connected to said second power supply terminal, and having a source;
   wherein said diode means comprises at least one first N-channel transistor having a gate, having a drain operatively connected to the gate and to the source of said first P-channel transistor, and having a source operatively connected to said power supply terminal; and
   wherein said inverter means comprises:
   a second P-channel transistor having a drain operatively connected to said first power supply terminal, having a gate operatively connected to the source of said first P-channel transistor, and having a source; and
   a second N-channel transistor having a drain operatively connected to the source of said second P-channel transistor, having a gate operatively connected to the gate of said second P-channel transistor and having a source operatively connected to said second power supply terminal.

10. A device as set forth in claim 9, wherein said inverter means further comprises:
    a third P-channel transistor operatively connected between said first power supply terminal and the drain of said second P-channel transistor and having a gate;
    a third N-channel transistor operatively connected between the source of said second N-channel transistor and said second power supply terminal and having a gate; and
    wherein said device further comprises controlling means, operatively connected to said third P-channel transistor and said third N-channel transistor, for commonly controlling the conductances of said third P-channel transistor and said third N-channel transistor.

11. A device as set forth in claim 10, wherein said controlling means comprises:
    load means operatively connected to said first power terminal;
    diode means operatively connected to said load means and to said second power supply terminal; and
    inverting-amplifier means operatively connected to said first and second power supply terminals, said inverting-amplifier means having an input connected to the connection point of said load means and said diode means and having an output connected to the gates of said third P-channel transistor and said third N-channel transistor.

12. A device as set forth in claim 10, wherein said controlling means comprises inverting-amplifier means operatively connected to said first and second power supply terminals, said inverting-amplifier means having an input operatively connected to said load means and having an output operatively connected to the gate of said third P-channel transistor and the gate of said third N-channel transistor.

13. A device as set forth in claim 1, wherein said power supply potential detecting circuit comprises:
    first and second resistance means operatively connected in series between said first and second power supply terminals;
    inverter means operatively connected to said first and second power supply terminals, said inverter means having an input operatively connected to the connection point of said first and second resistance means, and having an output; and waveform shaping means, operatively connected to said first and second power supply terminals and to the output of said inverter means, for shaping the waveform of the output of said inverter means to generate said reset signal.

14. A device as set forth in claim 13, wherein said inverter means comprises:
   a depletion-type transistor having a drain operatively connected to said first power supply terminal, having a source and having a gate operatively connected to the source; and
   an enhancement-type transistor having a drain operatively connected to the source of said second depletion-type transistor.

15. A device as set forth in claim 14, wherein said inverter means further comprises an additional enhancement-type transistor operatively connected between the source of said enhancement-type transistor and said second power supply termnal, and wherein said device further comprises controlling means for controlling the conductance of said additional enhancement-type transistor.

16. A device as set forth in claim 15, wherein said controlling means comprises:
   third and fourth resistance means operatively connected in series between said first and second power supply terminals; and
   inverting-amplifier means operatively connected to said first and second power supply terminals, said inverting-amplifier means having an input operatively connected to the connection point of said third and fourth resistance means and having an output operatively connected to the gate of said additional enhancement-type transistor.

17. A device as set forth in claim 15, wherein said controlling means comprises inverting-amplifier means operatively connected to said first and second power supply terminals, said inverting-amplifier means having an input connected to the connection point of said first and second resistance means and having an output operatively connected to the gate of said additional enhancement-type transistor.

18. A device as set forth in claim 1, wherein said power supply potential detecting circuit comprises:
   diode means operatively connected to said first power supply terminal;
   load means operatively connected to said diode means and to said second power supply terminal;
   inverter means operatively connected to said first and second power supply terminals, said inverter means having an input operatively connected to the connection point between said diode means and said load means, and having an output; and
   waveform shaping means, operatively connected to said first and second power supply terminals and to the output of said inverter means, for shaping the waveform of the output of said inverter means to generate said reset signal.

19. A device as set forth in claim 18, wherein said diode means comprises at least one first enhancement-type transistor having a gate, having a drain operatively connected to the gate and to said first power supply terminal, and having a source,
wherein said load means comprises a first depletion-type transistor having a drain operatively connected to the source of said first enhancement-type transistor, having a source and having a gate operatively connected to the source and to said second power supply terminal, and wherein said inverter means comprises:
   a second depletion-type transistor having a drain operatively connected to said first power supply terminal, having a source and having a gate operatively connected to the source; and
   a second enhancement-type transistor having a drain operatively connected to the source of said second depletion-type transistor.

20. A device as set forth in claim 19, wherein said inverter means further comprises a third enhancement-type transistor operatively connected between the source of said second power supply terminal and having a gate, and wherein said device further comprises controlling means for controlling the conductance of said third enhancement-type transistor.

21. A device as set forth in claim 20, wherein said controlling means comprises:
   diode means operatively connected to said first power supply terminal;
   load means operatively connected to said diode means and to said second power supply terminal; and
   inverting-amplifier means operatively connected to said first and second power supply terminals, said inverting-amplifier means having an input operatively connected to the connection point of said diode means and said load means and having an output operatively connected to the gate of said third enhancement-type transistor.

22. A device as set forth in claim 20, wherein said controlling means comprises inverting-amplifier means operatively connected to said first and second power supply terminals, said inverting-amplifier means having an input operatively connected to the connection point of said diode means and said load means, and having an output operatively connected to the gate of said third enhancement-type transistor.

23. A device as set forth in claim 1, wherein said internal circuit comprises a central processing unit.

24. A device as set forth in claim 1, wherein said power-supply-potential detecting circuit has an output, and wherein said generating means comprises:
   a decoder, operatively connected to said internal circuit, having an input for receiving an address therefrom, and generating an output in accordance with the input address; and
   a flip-flop, operatively connected to said decoder, being set and reset by the potential at the output of said decoder, and wherein
   said reset signal inhibiting circuit comprises an AND circuit having a first input operatively connected to the output of said power-supply-potential detecting circuit, having a second input operatively connected to the output of said flip-flop, and having an output operatively connected to said internal circuit.

* * * * *

UNITED STATES PATENT AND TRADEMARK OFFICE
CERTIFICATE OF CORRECTION

PATENT NO. : 4,551,841
DATED : NOVEMBER 5, 1985
INVENTOR(S) : KOUICHI FUJITA ET AL.

It is certified that error appears in the above-identified patent and that said Letters Patent is hereby corrected as shown below:

FRONT PAGE [57] ABSTRACT, line 6, "ize" should be --ize,--.

Col. 1, line 45, "than," should be --than--;
       line 58, "use" should be --for use--.

Col. 5, line 63, "he" should be --the--.

Col. 7, line 8, "4," should be --14,--.

Col. 8, line 1, "is," should be --is--;
       line 35, "rest" should be --reset--.

Signed and Sealed this

Fourth Day of February 1986

[SEAL]

Attest:

DONALD J. QUIGG

*Attesting Officer*   *Commissioner of Patents and Trademarks*